US008542550B2

(12) United States Patent
Kim et al.

(10) Patent No.: US 8,542,550 B2
(45) Date of Patent: Sep. 24, 2013

(54) SENSOR NODE ENABLED TO MANAGE POWER INDIVIDUALLY

(75) Inventors: Dong Sun Kim, Gyeonggi-do (KR); Kwang-Ho Won, Gyeonggi-do (KR); Seung Yerl Lee, Gyeonggi-do (KR)

(73) Assignee: Korea Electronics Technology Institute, Seongnam-si (KR)

( * ) Notice: Subject to any disclaimer, the term of this patent is extended or adjusted under 35 U.S.C. 154(b) by 155 days.

(21) Appl. No.: 13/117,207

(22) Filed: May 27, 2011

(65) Prior Publication Data

US 2012/0170397 A1     Jul. 5, 2012

(30) Foreign Application Priority Data

Dec. 29, 2010  (KR) .......................... 10-2100-138305

(51) Int. Cl.
*G11C 5/14*     (2006.01)
(52) U.S. Cl.
USPC .......................................... 365/226; 365/227

(58) Field of Classification Search
USPC .......................................... 365/226, 227, 228
See application file for complete search history.

(56) References Cited

U.S. PATENT DOCUMENTS

| 7,737,847 | B2 * | 6/2010 | Malone et al. ............. 340/572.1 |
| 2011/0127848 | A1 * | 6/2011 | Ryu et al. ..................... 307/104 |
| 2011/0130093 | A1 * | 6/2011 | Walley et al. ................ 455/41.1 |

FOREIGN PATENT DOCUMENTS

| KR | 10-2001-0062773 A | 7/2001 |
| KR | 10-2010-0092662 A | 8/2010 |

OTHER PUBLICATIONS

Korean Patent Office, Korean Office Action issued in corresponding KR Application No. 10-2010-0138305, dated Aug. 30, 2012.

* cited by examiner

*Primary Examiner* — Vu Le
(74) *Attorney, Agent, or Firm* — Sughrue Mion, PLLC

(57) ABSTRACT

A sensor node is provided. The sensor node regulates the power supplied to memories of a memory unit individually and the power supplied to a transmitter and a receiver of an RF transceiver individually. Thus, the sensor node can minimize its power consumption.

9 Claims, 7 Drawing Sheets

FIG. 3

| Block | Function | Power Reduction |
|---|---|---|
| Embedded processor | 16 MHz main clock | 8% |
| | 8 MHz main clock | 17% |
| SRAM | 1 Kbytes SRAM | 3% |
| Flash memory | 8 Kbytes Flash | 9% |
| RF | Receiver | 32% |
| | Transmitter | 28% |
| Dedicated hardware function | AES security hardware | 4% |
| | Peripherals | 1~3% |
| | Hardwired MAC and Network function | 5% |

SENSOR NODE ENABLED TO MANAGE POWER INDIVIDUALLY

CROSS-REFERENCE TO RELATED APPLICATION

This application claims priority to Korean patent application filed in the Korean Intellectual Property Office on Dec. 29, 2010, and assigned Serial No. 10-2010-0138305, which is incorporated by reference in its entirety.

TECHNICAL FIELD OF THE INVENTION

The present invention relates generally to a sensor node. More particularly, the present invention relates to a sensor node which is enabled to manage power supply in various manners.

BACKGROUND OF THE INVENTION

Wireless network technology for Ubiquitous Sensor Network (USN) is the core technology to realize an environment allowing to interconnect anything such as a person to a person, an object to an object, machine to machine, a product to a product, a network to a network, an organization to an organization, in a space, and to exchange information or action in real-time or if necessary.

To construct such an environment, a computer including an embedded wireless interface function should be planted in the environment and the object so that the environment or the object itself becomes intelligent to recognize, perceive, monitor, and trace the surrounding space shape through a micro sensor. Also, the computers containing the information should be connected over the ubiquitous wireless network to exchange their information reciprocally.

To fulfill those functions, a micro and low-power wireless chipset technology and a networking technology to wirelessly interconnect the small chips and sensor devices can be applied.

It is necessary to research and develop techniques for implementing a comfortable, safe, and convenient green u-life for the sake of sustainable USN infrastructure and service environment construction based on remote energy supply chain, by ensuring reliability of the USN application service, applying the USN to various industries, and developing the remote energy supply chain technique with long-term lifetime, a low-power structure of the sensor node and a method for supplying and obtaining a self-sustainable power supply, a standardized sensor interface, and a self-sustainable sensor node platform and a sensor node based on System-on-Chip (SoC) which are light-weighted and easily supplied to provide user-friendly development environment.

However, the sensor node used to construct such an environment needs to be turned on all the time and thus consumes considerable power. Thus, what is needed is a method for reducing the power consumption of the sensor node.

SUMMARY OF THE INVENTION

To address the above-discussed deficiencies of the prior art, it is a primary aspect of the present invention to provide a sensor node for regulating power supplied to memories in a memory unit individually and for regulating power supplied to a transmitter and a receiver in an RF transceiver individually.

According to an aspect of the present invention, the sensor node includes a memory unit including a plurality of memories; a Radio Frequency (RF) transceiver including a transmitter and a receiver for transmitting and receiving a radio signal to and from the outside; and a power management unit for regulating power supplied to the memories of the memory unit individually, and power supplied to the transmitter and the receiver of the RF transceiver individually.

The memory unit may include a Static Random Access Memory (SRAM) and a flash memory, and the power management unit may regulate the power supplied to the SRAM and the flash memory individually.

The power management unit may deactivate unused banks of the SRAM and the flash memory.

The sensor node may further include a clock signal generator for generating a clock signal of a frequency determined according to a remaining battery capacity of a battery unit.

The clock signal generator may generate the clock signal of one of 24 MHz, 16 MHz, and 8 MHz frequencies according to the remaining battery capacity.

The power management unit may block the power to part of an unused hardware block according to the remaining battery capacity of the battery unit.

When only data transmission is performed, the power management unit may block the power supply of the receiver.

When only data reception is performed, the power management unit may block the power supply of the transmitter.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 3 is a table of the power consumption reduction according to an exemplary embodiment of the present invention;

Throughout the drawings, like reference numerals will be understood to refer to like parts, components and structures.

DETAILED DESCRIPTION OF THE INVENTION

Certain exemplary embodiments of the present disclosure will now be described in greater detail with reference to the accompanying drawings.

Figure 1:
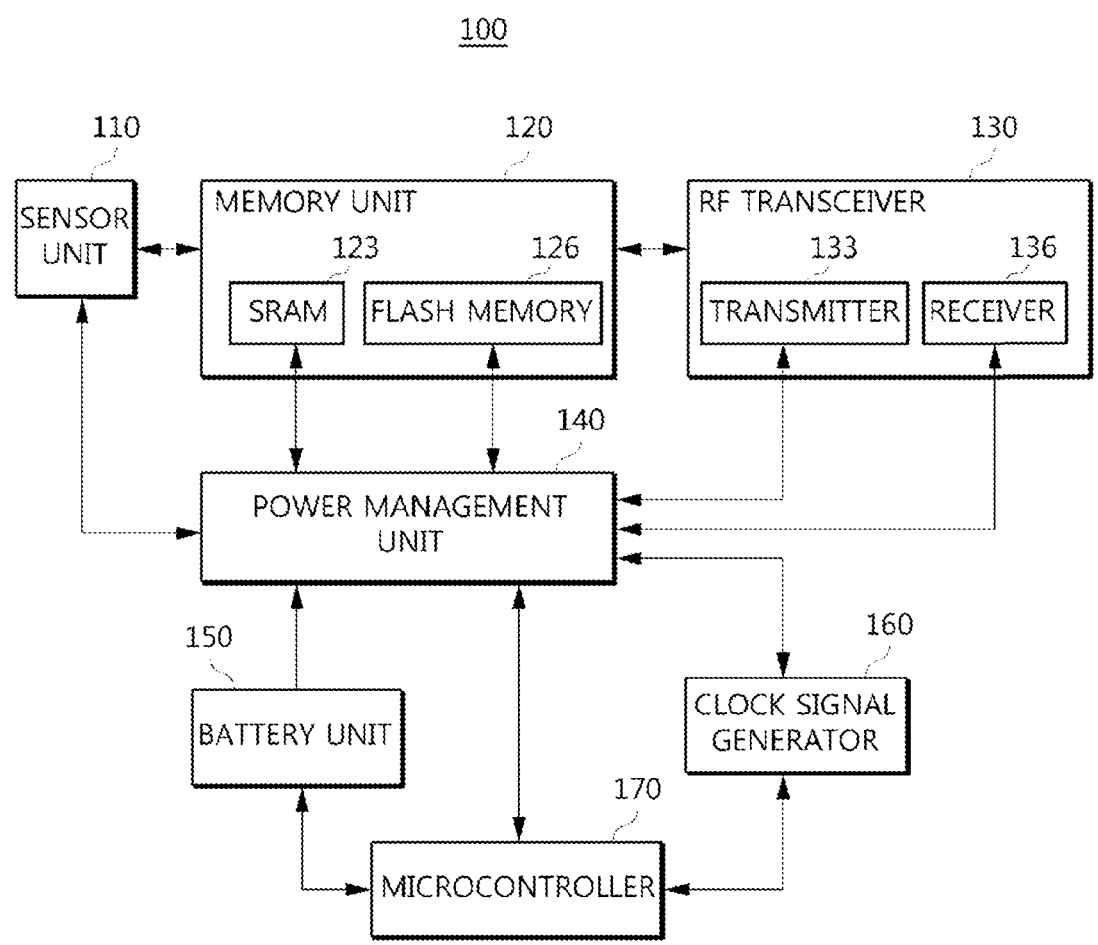
FIG. 1 is a block diagram of a sensor node according to an exemplary embodiment of the present invention.

FIG. 1 is a block diagram of a sensor node 100 according to an exemplary embodiment of the present invention. The sensor node 100 of FIG. 1 includes a sensor unit 110, a memory unit 120, an RF transceiver 130, a power management unit 140, a battery unit 150, a clock signal generator 160, and a controller 170.

The sensor unit 110 detects a physical quantity to be measured by the sensor node 100. For example, when the sensor node 100 is to measure a temperature, the sensor unit 110 is a temperature sensor for measuring the temperature. When the sensor node 100 is to measure humidity, the sensor unit 110 is a humidity sensor for measuring the humidity.

The memory unit 120 includes a variety of memories for storing data required to operate the sensor node 100. In detail, the memory unit 120 includes a Static Random Access Memory (SRAM) 123 and a flash memory 126. The SRAM 123, which is a volatile memory, is used to provide a buffer space to process data. The flash memory 126, which is a non-volatile memory, is used to store data. Besides, the memory unit 120 can include other various memories.

The RF transceiver 130 transmits and receives radio signals to and from the outside. The RF transceiver 130 transmits the data detected by the sensor unit 110 to an external device. The RF transceiver 130 performs wireless communication using RF signals.

The RF transceiver 130 includes a transmitter 133 and a receiver 136 as shown in FIG. 1. The transmitter 133 transmits the radio signal and includes a digital modulator and dedicated transmit hardware. The receiver 136 receives the radio signal and includes a digital demodulator and dedicated receive hardware.

The power management unit 140 regulates the power supplied to the memories of the memory unit 120 individually. The power management unit 140 regulates the power supplied to the transmitter 133 and the receiver 136 of the RF transceiver 130 individually. In addition, the power management unit 140 controls the power supply of a macrocontroller 160 of the sensor node 100 and other hardware blocks (not shown) individually. For doing so, the power management unit 140 supplies the power to the components through separate lines as shown in FIG. 1. To supply the power to the components through separate lines, the power management unit 140 may include a regulator. For example, to supply the power through four lines, the power management unit 140 can include four channel regulators.

As the power management unit 140 supplies the appropriate power to the components, the power consumption can be minimized.

More specifically, the power management unit 140 deactivates unused banks of the RAM 123 and the flash memory 126. Since the power management unit 140 can supply only the power used at the activated banks of the RAM 123 and the flash memory 126, the power consumption of the RAM 123 and the flash memory 126 can be reduced.

The power management unit 140 cuts the power supply to the unused unit of the transmitter 133 and the receiver 136 of the RF transceiver 130. When only the data transmission is conducted, the power management unit 140 cuts the power supply of the receiver 136. When only the data reception is conducted, the power management unit 140 cuts the power supply of the transmitter 133.

The power management unit 140 cuts and supplies the power to the unused hardware blocks individually with respect to other hardware blocks (AES security hardware, peripherals, hardwired MAC and network function, etc.). In particular, the power management unit 140 blocks the power of part of the unused hardware block according to the remaining battery capacity of the battery unit 150.

As such, the power management unit 140 can manage the power individually by supplying the power to the components through the separate lines, and thus reduce the unnecessary power consumption.

The battery unit 150 supplies the power into the sensor node 100 via the power management unit 140.

The clock signal generator 160 generates a clock signal used in the sensor node 100. The clock signal generator 160 can generate the clock signal of various frequencies. For instance, the clock signal generator 160 can generate the clock signal of 24 MHz, 16 MHz, and 8 MHz. The clock signal generator 160 can be implemented using a Phase-Locked Loop (PLL).

The clock signal generator 160 generates the clock signal of the frequency determined based on the remaining battery capacity of the battery unit 150. For example, when the remaining battery capacity exceeds 80%, the clock signal generator 160 generates the clock signal of 24 MHz. When the remaining battery capacity falls below 80%, the clock signal generator 160 generates the clock signal of 16 MHz. When the remaining battery capacity falls below 40%, the clock signal generator 160 can generate the clock signal of 8 MHz. As such, the frequency of the clock signal of the clock signal generator 160 is controlled by the power management unit 140.

The microcontroller 170 controls operations of the sensor node 100. The microcontroller 170 operates using the clock signal generated by the clock signal generator 160.

The sensor node 100 constructed as above can regulate the power supply with respect to the internal components respectively. Thus, the sensor node 100 can minimize the power consumption.

Figure 2:
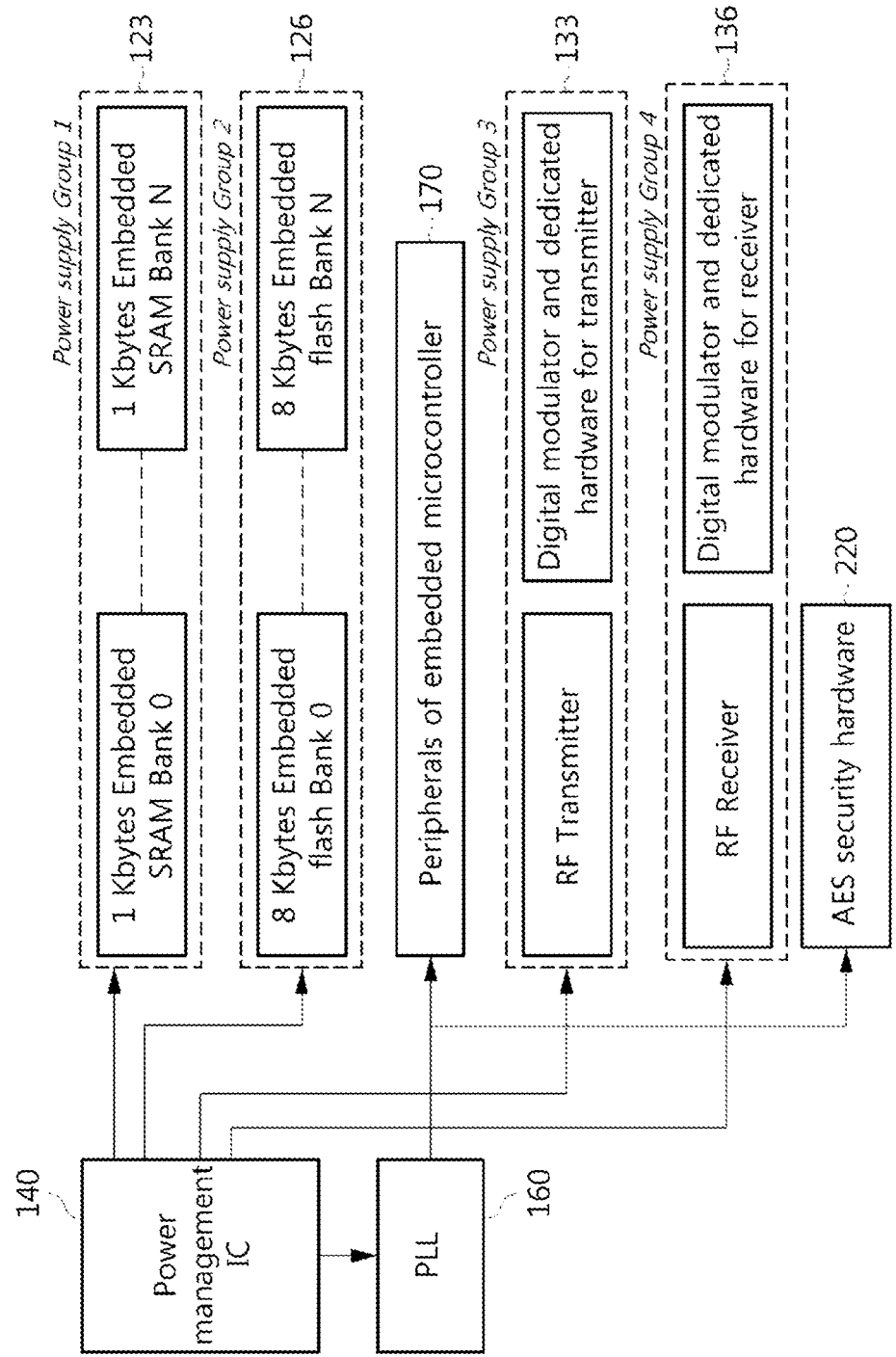
FIG. 2 is a diagram of the sensor node construction according to an exemplary embodiment of the present invention.

FIG. 2 depicts a construction of the sensor node 100 according to an exemplary embodiment of the present invention. In FIG. 2, the power supply group is divided into four groups. In detail, the SRAM 123 belongs to the power supply group 1, the embedded flash memory 126 belongs to the power supply group 2, the transmitter 133 belongs to the power supply group 3, and the receiver 136 belongs to the power supply group 4. The power management IC 140 regulates the power supplied to the power supply groups separately.

The clock signal generator (the PLL) 160 regulates the power consumption by controlling the clock signals of the microcontroller (peripherals of the embedded microcontroller) 170 and the AES security hardware 220.

The power management IC 140 regulates the power supplied to each power supply group and the frequency of the clock signal of the clock signal generator 160, thus reducing the power consumption.

FIG. 3 is a table showing the power consumption reduction according to an exemplary embodiment of the present invention. As shown in FIG. 3, compared to the clock signal of 24 MHz, the clock signal of 16 MHz reduces the power consumption by 8% and the clock signal of 8 MHz reduces the power consumption by 17%.

The SRAM 123 exhibits the power reduction of 3% every time the 1-Kbyte bank is deactivated. The flash memory 126 exhibits the power reduction of 9% every time the 8-Kbyte bank is deactivated.

In the RF transceiver 130, the power reduces by 32% when the receiver 136 is deactivated and by 28% when the transmitter 133 is deactivated.

In the hardware blocks, the power reduces by 4% when the AES security hardware is deactivated, the power reduces by 1~3% when the peripherals are deactivated, and the power reduces by 5% when the hardwired MAC the network function are deactivated.

As such, the sensor node 100 can regulate the power supply to the internal components individually by means of the power management IC 140. Thus, the sensor node 100 can minimize the power consumption.

Figure 4:
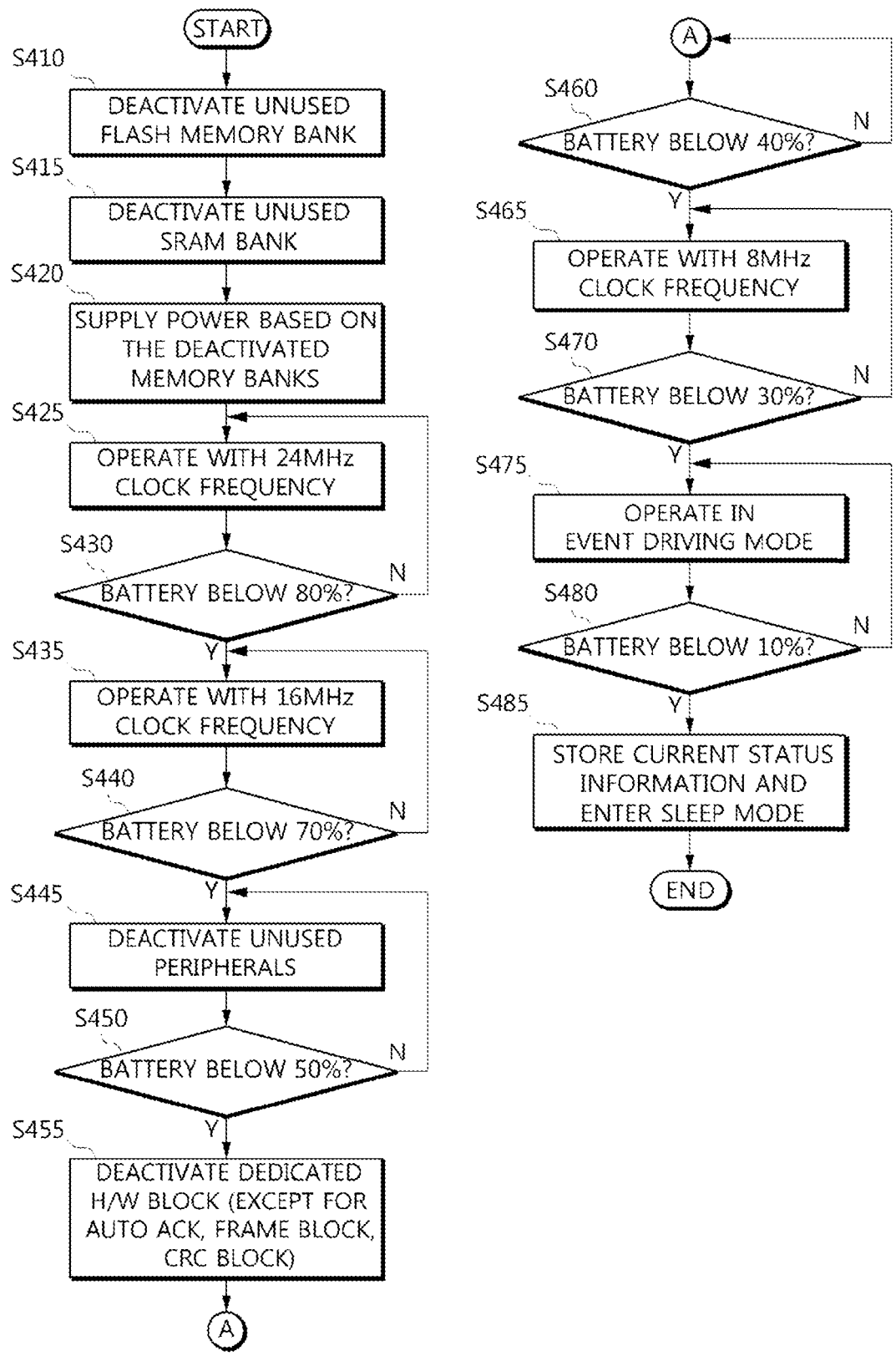
FIG. 4 is a flowchart of a method for regulating the power according to an exemplary embodiment of the present invention.

FIG. 4 is a flowchart of a method for regulating the power according to an exemplary embodiment of the present invention.

The sensor node 100 deactivates the unused bank of the flash memory 126 (S410). The sensor node 100 deactivates the unused bank of the SRAM 123 (S415). Next, the sensor node 100 supplies the power to the other memory banks than the deactivated memory banks (S420).

The sensor node 100 operates by generating the clock signal with the clock frequency of 24 MHz (S425). The sensor node 100 checks whether the remaining capacity of the battery falls below 80% (S430). When the remaining capacity of the battery falls below 80% (S430-Y), the sensor node 100 operates by changing the clock frequency to 16 MHz and generating the clock signal (S435).

Next, the sensor node 100 checks whether the remaining capacity of the battery falls below 70% (S440). When the remaining capacity of the battery falls below 70% (S440-Y), the sensor node 100 deactivates the peripherals which are the unused hardware block and cuts the power supply (S445).

Next, the sensor node 100 checks whether the remaining capacity of the battery falls below 50% (S450). When the remaining capacity of the battery falls below 50% (S450-Y), the sensor node 100 deactivates the unused dedicated hardware block and cuts the power supply (S455). At this time, the auto ACK, the frame block, and the CRC block are excluded from the deactivation.

Next, the sensor node 100 checks whether the remaining capacity of the battery falls below 40% (S460). When the remaining capacity of the battery falls below 40% (S460-Y), the sensor node 100 operates by changing the clock frequency to 8 MHz and generating the clock signal (S465).

Next, the sensor node 100 checks whether the remaining capacity of the battery falls below 30% (S470). When the remaining capacity of the battery falls below 30% (S470-Y), the sensor node 100 operates in an event driving mode (S475). Herein, the event driving mode is the mode which minimizes the power consumption. In the event driving mode, the sensor node 100 minimizes its functions.

At last, the sensor node 100 checks whether the remaining capacity of the battery falls below 10% (S480). When the remaining capacity of the battery falls below 10% (S480-Y), the sensor node 100 stores the current status information and then enters a sleep mode (S485). Herein, the sleep mode deactivates all of the functions other than the essential functions of the sensor node 100.

As above, the sensor node 100 can deactivate the unused memory bank, block the power of the hardware block according to the remaining battery capacity, and regulate the frequency of the clock signal. Hence, the sensor node 100 can minimize the power consumption.

Figure 5:
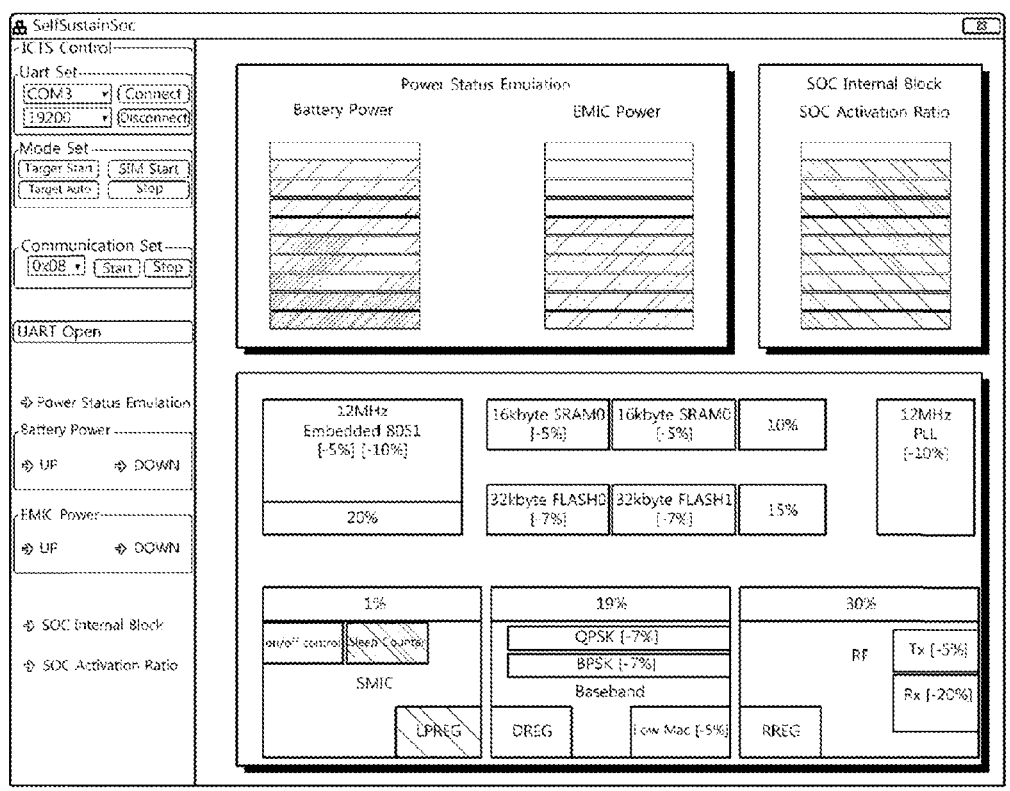
FIG. 5 is a diagram of a GUI for checking a power management status according to an exemplary embodiment of the present invention.

FIG. 5 illustrates a GUI for checking the power management status according to an exemplary embodiment of the present invention. Through the GUI, it is possible to obtain the battery capacity and the functions in operation according to the battery capacity as shown in FIG. 5.

Figure 6:
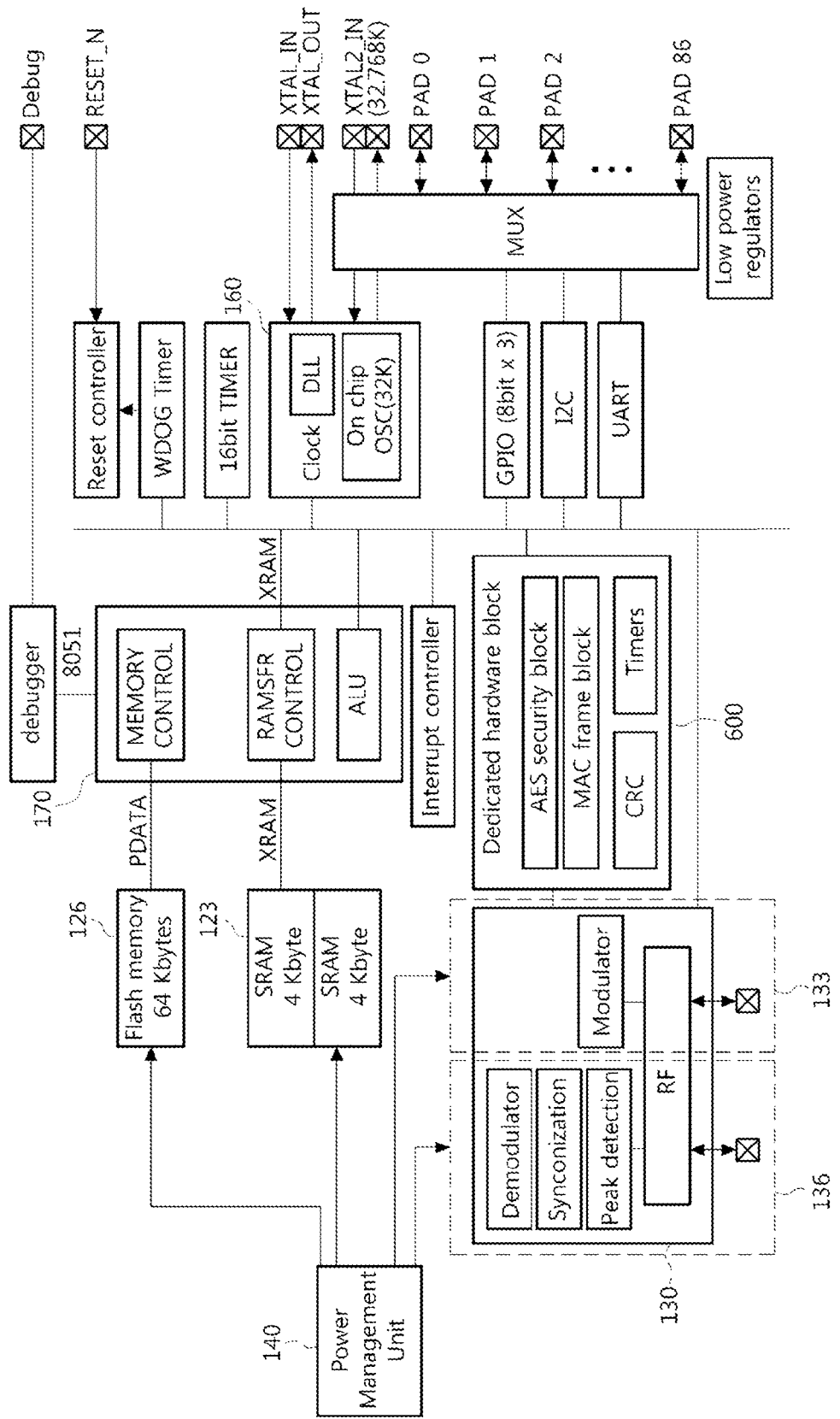
FIG. 6 is a detailed diagram of the sensor node according to an exemplary embodiment of the present invention.

FIG. 6 is a detailed diagram of the sensor node 100 according to an exemplary embodiment of the present invention. In FIG. 6, general constructions shall not be explained and the parts compared to FIG. 1 shall be mainly illustrated.

As shown in FIG. 6, the sensor node 100 includes the RF transceiver 130, the microcontroller 170, the power management unit 140, and a dedicated hardware block 600.

The RF transceiver 130 basically includes a modulator including a 6-bit Digital-Analog Converter (DAC), and a demodulator including a 4-bit Analog-Digital Converter (ADC). The DAC and the ADC are used to send or receive the RF signal. The modulator not only generates a PSDU format but also spreads the data using a chip sequence and modulates the data using QPSK. The OQPSK using half sine pulse shaping is almost the same as the MSK modulation which can be used to fabricate a low-cost receiver having the spectral efficiency.

The RF transceiver 130 supports the data rate 250 kbps in the 2.4 Ghz band. The transmitter 133 employs a DSSS scheme using 32 chips through 16 quasi-orthogonal spreading code. The receiver 136 includes three blocks for packet detection, synchronization, and data restoration. The packet detection block checks a signal power and preamble data to commence the decoding. In the synchronization, a carrier frequency synchronization block operates to estimate frequency error based on the preamble and a phase compensation block operates to rotate the phase. A de-spreading block operates to analyze a physical header containing packet information. To restore the data, a symbol-to-bit block operates to recover a data bit stream and a phase tracking block begins the detailed phase error tracking. Other blocks are turned off in sequence to save the power.

The microcontroller 170 executes a software protocol and controls the peripherals.

The dedicated hardware block 600 supports four programmable timers to check timing violations such as CRC and acknowledgement response time. A MAC frame block generates the transmitted data frame and analyzes information of the received frame. The MAC frame block automatically generates and transmits an acknowledgement frame for Carrier Sense Multiple Access-Collision Avoidance (CSMA-CA) protocol. An AES-128 block encodes the received payload data. An Implemented security block decodes the data and automatically sends the decoded data to the MAC frame block.

The sensor node 100 constructed as above can regulate the power supply to the SRAM 123, the flash memory 126, the transmitter 133, and the receiver 136 individually. Thus, the sensor node 100 can minimize the power consumption.

Figure 7:
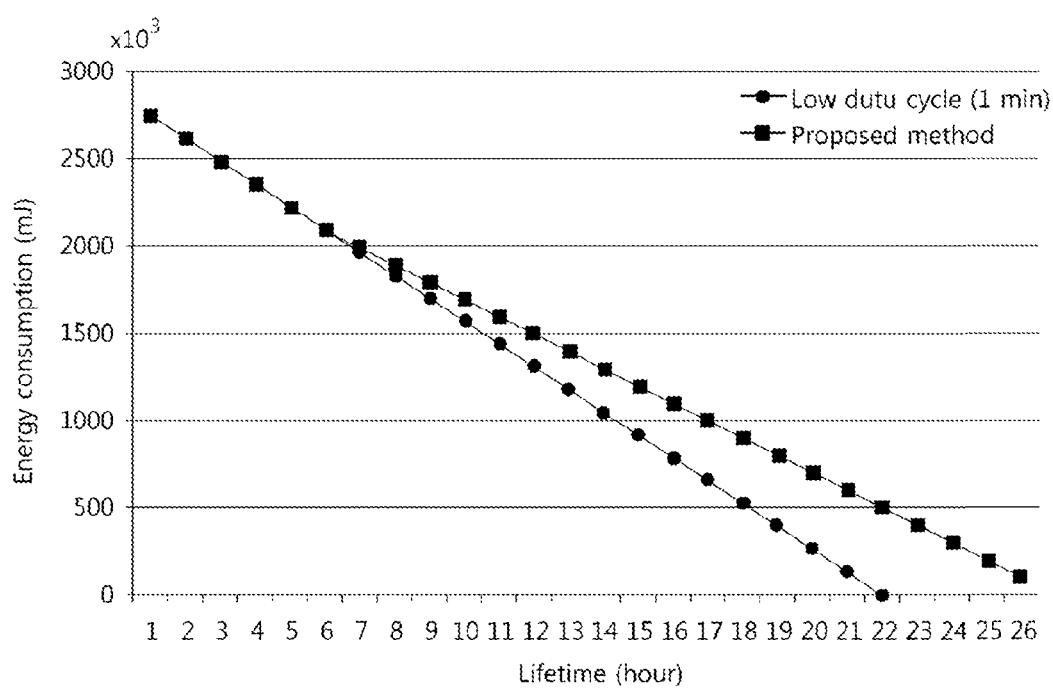
FIG. 7 is a graph for comparing a lifetime of a conventional sensor node and the present sensor node.

FIG. 7 is a graph for comparing a lifetime of a conventional sensor node and the present sensor node 100. In FIG. 7, a first graph is the lifetime graph of the conventional sensor node and a second graph is the lifetime graph of the present sensor node 100.

The lifetime of the present sensor node 100 is longer than the conventional sensor node by 18% as shown in FIG. 8. In conclusion, the present sensor node 100 can prolong its battery and reduce the power consumption as much.

Note that the sensor node 100 can be implemented in various forms and in the form of a System-on-Chip (SoC). The sensor node 100 can be installed to various devices.

In the light of the foregoing as set forth above, the sensor node can regulate the power supplied to the memories of the memory unit individually and the power supplied to the transmitter and the receiver of the RF transceiver individually. Therefore, the power consumption of the sensor node can be minimized.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A sensor node comprising:
   a memory unit comprising a plurality of memories;
   a Radio Frequency (RF) transceiver comprising a transmitter and a receiver for transmitting and receiving a radio signal to and from the outside; and
   a power management unit for regulating power supplied to the memories of the memory unit individually, and power supplied to the transmitter and the receiver of the RF transceiver individually.

2. The sensor node of claim 1, wherein the memory unit comprises a Static Random Access Memory (SRAM) and a flash memory, and the power management unit regulates the power supplied to the SRAM and the flash memory individually.

3. The sensor node of claim 2, wherein the power management unit deactivates unused banks of the SRAM and the flash memory.

4. The sensor node of claim 1, further comprising:
   a clock signal generator for generating a clock signal of a frequency determined according to a remaining battery capacity of a battery unit.

5. The sensor node of claim 4, wherein the clock signal generator generates the clock signal of one of 24 MHz, 16 MHz, and 8 MHz frequencies according to the remaining battery capacity.

6. The sensor node of claim 1, wherein the power management unit blocks the power to part of an unused hardware block according to the remaining battery capacity of the battery unit.

7. The sensor node of claim 1, wherein, when only data transmission is performed, the power management unit blocks the power supply of the receiver.

8. The sensor node of claim 1, wherein, when only data reception is performed, the power management unit blocks the power supply of the transmitter.

9. The sensor node of claim 1, wherein the power management unit regulates power supplied to the memories of the memory unit individually, and power supplied to the transmitter and the receiver of the RF transceiver individually, according to a remaining battery capacity of a battery unit.

* * * * *

UNITED STATES PATENT AND TRADEMARK OFFICE
CERTIFICATE OF CORRECTION

PATENT NO. : 8,542,550 B2
APPLICATION NO. : 13/117207
DATED : September 24, 2013
INVENTOR(S) : Dong Sun Kim et al.

Page 1 of 1

It is certified that error appears in the above-identified patent and that said Letters Patent is hereby corrected as shown below:

On the Title page, item (30) Foreign Application Priority Data, "10-2100-0138305" should read --10-2010-0138305--.

Signed and Sealed this
First Day of April, 2014

Michelle K. Lee
*Deputy Director of the United States Patent and Trademark Office*